(12) United States Patent
Hirabayashi et al.

(10) Patent No.: US 10,146,126 B2
(45) Date of Patent: *Dec. 4, 2018

(54) GLASS SUBSTRATE FOR MASK BLANK, MASK BLANK, PHOTOMASK, AND METHOD FOR MANUFACTURING GLASS SUBSTRATE FOR MASK BLANK

(71) Applicant: Asahi Glass Company, Limited, Chiyoda-ku (JP)

(72) Inventors: Yusuke Hirabayashi, Chiyoda-ku (JP); Yuzo Okamura, Chiyoda-ku (JP); Nobuhiko Ikenoya, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/879,613

(22) Filed: Jan. 25, 2018

(65) Prior Publication Data

US 2018/0149964 A1 May 31, 2018

Related U.S. Application Data

(63) Continuation of application No. 15/274,141, filed on Sep. 23, 2016.

(30) Foreign Application Priority Data

| Sep. 28, 2015 | (JP) | ................................. | 2015-189156 |
| Jun. 8, 2016 | (JP) | ................................. | 2016-114874 |

(51) Int. Cl.
| *G03F 1/60* | (2012.01) |
| *G03F 1/48* | (2012.01) |
| *G03F 1/52* | (2012.01) |

(52) U.S. Cl.
CPC .................. *G03F 1/60* (2013.01); *G03F 1/48* (2013.01); *G03F 1/52* (2013.01)

(58) Field of Classification Search
CPC ..... G03F 1/60; G03F 1/48; G03F 1/52; G03F 1/54

(Continued)

(56) References Cited

U.S. PATENT DOCUMENTS

| 2010/0035028 A1* | 2/2010 | Tanabe ...................... G03F 1/60 |
| | | 428/195.1 |
| 2011/0287219 A1* | 11/2011 | Matsui ................... B82Y 10/00 |
| | | 428/141 |

(Continued)

FOREIGN PATENT DOCUMENTS

| JP | 2012-9833 A | 1/2012 |
| JP | 2013-82612 | 5/2013 |

(Continued)

OTHER PUBLICATIONS

Computer-generated translation of (Mar. 2013).*

(Continued)

*Primary Examiner* — John A McPherson
(74) *Attorney, Agent, or Firm* — Oblon, McClelland, Maier & Neustadt, L.L.P.

(57) ABSTRACT

A glass substrate for a mask blank includes a rectangular-shaped main surface on which a film having a circuit pattern is to be formed. The main surface includes a quadrangular peripheral frame and a square-shaped center area defined by excluding the frame. The center area has a longitudinal length of 142 mm and a lateral length of 142 mm. A surface morphology of the center area is expressed by the following formulas. A flatness of a sum of compositing all of $a_{kl}P_k(x)P_l(y)$ is less than or equal to 20 nm when a sum of k and l is greater than or equal to 3 and less than or equal to 9. The flatness is less than or equal to 20 nm when a sum of k and l is greater than or equal to 10 and less than or equal to 30.

(Continued)

$$\begin{cases} z(x, y) = \sum_{k=0}^{N_1} \sum_{l=0}^{N_2} a_{kl} P_k(x) P_l(y) \\ P_k(x) = \frac{1}{2^k k!} \frac{d^k}{dx^k} \left[ (x^2 - 1)^k \right] \\ P_l(y) = \frac{1}{2^l l!} \frac{d^l}{dy^l} \left[ (y^2 - 1)^l \right] \end{cases}$$

11 Claims, 6 Drawing Sheets

(58) Field of Classification Search
USPC .............................................. 430/5
See application file for complete search history.

(56) References Cited

U.S. PATENT DOCUMENTS

2012/0258389 A1* 10/2012 Maida ................. C03B 19/1415
 430/5
2016/0109797 A1* 4/2016 Tanabe ..................... G03F 1/60
 430/5

FOREIGN PATENT DOCUMENTS

| JP | 2014-199847 A | 10/2014 |
| JP | 2013-043238 A * | 3/2018 |
| WO | WO 2012/102313 A1 | 8/2012 |

OTHER PUBLICATIONS

N. Harned, et al. "EUV Mask flatness compensation in writing and exposure tools relating to total overlay", 2007 International EUVL Symposium, 2007, 25 pages.

* cited by examiner

GLASS SUBSTRATE FOR MASK BLANK, MASK BLANK, PHOTOMASK, AND METHOD FOR MANUFACTURING GLASS SUBSTRATE FOR MASK BLANK

CROSS-REFERENCE TO RELATED APPLICATIONS

The present application is a continuation application of U.S. patent application Ser. No. 15/274,141, filed on Sep. 23, 2016, which is based on and claims the benefit of priority Japanese Priority Application Nos. 2015-189156 and 2016-114874 filed on Sep. 28, 2015 and Jun. 8, 2016, respectively, with the Japanese Patent Office. The entire contents of these applications are hereby incorporated by reference.

BACKGROUND

Field

The disclosure discussed herein relates to a glass substrate for a mask blank, a mask blank, a photomask, and a method for manufacturing a glass substrate for a mask blank.

Description of Related Art

A mask blank includes a glass substrate and a film formed on a main surface of the glass substrate. The number of the film may be one or more films. The film may be formed by overlapping multiple films. A photomask is obtained by forming a circuit pattern on at least one film. In a semiconductor exposing process, a circuit pattern of a photomask is reduced in size and transferred to a wafer. The main surface of the glass substrate is desired to have a high flatness, so that positional deviation of the circuit pattern (hereinafter also referred to as "pattern overlay accuracy") is within a permissible range. A center area of the main surface of the glass substrate is particularly desired to have high flatness because a circuit pattern is formed in the center area of the main surface of the film on the glass substrate.

Processes such a polishing and local processing (see, for example, Patent Document 1) are performed for improving the flatness of the main surface of the glass substrate. In the first example of Patent Document 1, a hard polishing pad is used in a rough polishing step whereas a polishing pad having a porous resin layer (referred to as nap layer) is used in a fine polishing step. The 100% modulus of the resin of the porous resin layer is greater than or equal to 14.5 MPa.

RELATED ART DOCUMENT

Patent Document

Patent Document 1: Japanese Laid-Open Patent Publication No. 2013-82612

Conventionally, a sufficient flatness could not be attained at the center area of the main surface of the glass substrate and pattern overlay accuracy on a wafer is not accordingly sufficient even if local polishing is conducted after global polishing because the hardness of the polishing pad is too hard or too soft.

In light of the above-described difficulty, an aspect of the present invention is aimed to provide a glass substrate for a mask blank that improves the flatness of the center area of the main surface of the glass substrate and has a sufficient pattern overlay accuracy.

SUMMARY

According to an aspect of the disclosure discussed herein, there is provided a glass substrate for a mask blank, a mask blank, a photomask, and a method for manufacturing a glass substrate for a mask blank that substantially obviate one or more of the problems caused by the limitations and disadvantages of the related art.

Features and advantages of the disclosure are set forth in the specification which follows, and in part will become apparent from the description and the accompanying drawings, or may be learned by practice of the disclosure according to the teachings provided in the specification. Objects as well as other features and advantages of the disclosure will be realized and attained by a glass substrate for a mask blank, a mask blank, a photomask, and a method for manufacturing a glass substrate for a mask blank particularly pointed out in the specification in such full, clear, concise, and exact terms as to enable a person having ordinary skill in the art to practice the disclosure.

To achieve these and other advantages and in accordance with the purpose of the disclosure, as embodied and broadly described herein, the disclosure provides a glass substrate for a mask blank includes a rectangular-shaped main surface on which a film having a circuit pattern is formed. The main surface includes a quadrangular peripheral frame and a square-shaped center area defined by excluding the quadrangular peripheral frame. The center area has a longitudinal length of 142 mm and a lateral length of 142 mm. A surface morphology of the center area is expressed by $$\begin{cases} z(x,y) = \sum_{k=0}^{N_1} \sum_{l=0}^{N_2} a_{kl} P_k(x) P_l(y) \\ P_k(x) = \frac{1}{2^k k!} \frac{d^k}{dx^k}\left[(x^2-1)^k\right] \\ P_l(y) = \frac{1}{2^l l!} \frac{d^l}{dy^l}\left[(y^2-1)^l\right] \end{cases}.$$

A flatness of a sum of compositing all of $a_{kl}P_k(x)P_l(y)$ is less than or equal to 20 nm in a case where a sum of k and l is greater than or equal to 3 and less than or equal to 9. The flatness of the sum of compositing all of $a_{kl}P_k(x)P_l(y)$ is less than or equal to 20 nm in a case where a sum of k and l is greater than or equal to 10 and less than or equal to 30.

Other objects, features and advantages of the disclosure will become more apparent from the following detailed specification when read in conjunction with the accompanying drawings.

DETAILED DESCRIPTION OF THE EMBODIMENTS

Figure 1:
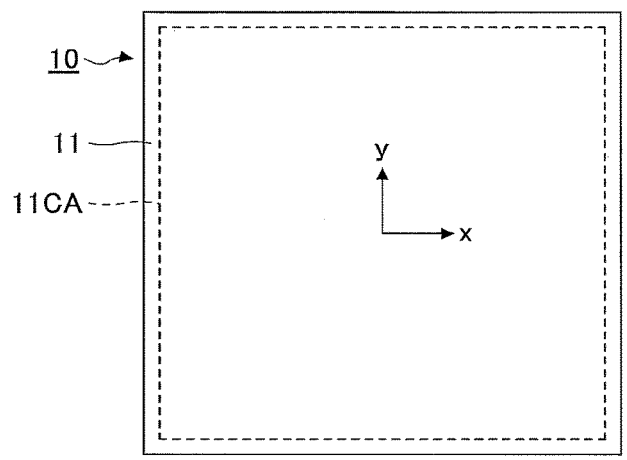
FIG. 1 is a plan view of a glass substrate according to an embodiment of the present invention.

Next, embodiments of the present invention are described with the accompanying drawings. Throughout the drawings, like components and parts are denoted with like reference numerals and are not redundantly described.

FIG. 1 is a plan view of a glass substrate 10 according to an embodiment of the present invention. In FIG. 1, the x direction indicates a lateral direction whereas the y direction indicates a longitudinal direction. The x direction and y direction orthogonally intersect with each other.

The glass substrate 10 is used for a mask blank. The mask blank includes the glass substrate 10 and a film formed on a main surface 11 of the glass substrate 10. The number of the film may be one or more films. Multiple films may be overlapped to form the film formed on the main surface 11 of the glass substrate 10. A photomask is obtained by forming a circuit pattern on at least a single film.

The glass of the glass substrate 10 is preferably quartz glass including $SiO_2$ of no less than 90% by mass. The upper limit of the $SiO_2$ included in the quartz glass is 100% by mass. In comparison with a typical soda-lime glass, quartz glass has a small coefficient of thermal expansion and exhibits small dimension change against temperature change.

The quartz glass may include not only $SiO_2$ but also $TiO_2$. The quartz glass may include 90 to 95% $SiO_2$ by mass and 5 to 10% $TiO_2$ by mass. In a case where the quartz glass includes 5 to 10% $TiO_2$ by mass, the quartz glass has substantially zero coefficient of thermal expansion at the vicinity of room temperature and hardly exhibits dimension change at the vicinity of room temperature.

Although a small amount of other material besides $SiO_2$ and $TiO_2$ may be included in the quartz glass, the small amount of the other material is preferred not to be included in the quartz glass.

As illustrated in FIG. 1, the glass substrate 10 has a rectangular main surface 11. Note that the term "rectangular" not only includes a rectangle or a square but also a rectangle or square having its corners chamfered. The main surface 11 is a plane on which a film having a circuit pattern is formed. The main surface 11 may also be hereinafter referred to as a circuit pattern forming surface 11. Further, another main surface 12 formed on the opposite side of the circuit pattern forming surface 11 may be hereinafter referred to as circuit pattern non-forming surface 12 (see, for example, FIGS. 6 to 9).

The circuit pattern forming surface 11 may be, for example, a rectangle having a longitudinal length of 152 mm and a lateral length of 152 mm. In the circuit pattern forming surface 11, an area excluding the quadrangle frame-shaped outer peripheral area of the circuit pattern forming surface 11 and the center area 11CA may be a square having a longitudinal length of 142 mm and a lateral length of 142 mm may be referred to as a center area 11CA of the circuit pattern forming surface 11. The center of the center area 11CA matches the center of the circuit pattern forming area 11.

Note that, the longitudinal length of the circuit pattern forming surface 11 may be greater than or equal to 152 mm. Further, the lateral length of the circuit pattern forming surface 11 may be greater than or equal to 152 mm. In this case also, the longitudinal length of the center area 11CA may be 142 mm and the lateral length of the center area 11A may be 142 mm.

The surface morphology of the center area 11CA may be expressed with the following Expression 1.

$$\begin{cases} z(x, y) = \sum_{k=0}^{N_1} \sum_{l=0}^{N_2} a_{kl} P_k(x) P_l(y) \\ P_k(x) = \frac{1}{2^k k!} \frac{d^k}{dx^k}\left[(x^2 - 1)^k\right] \\ P_l(y) = \frac{1}{2^l l!} \frac{d^l}{dy^l}\left[(y^2 - 1)^l\right] \end{cases} \quad \text{[Expression 1]}$$

In Expression 1, "x" indicates the coordinates in the lateral direction, "y" indicates the coordinates in the longitudinal direction, and "z" indicates the coordinates in the height direction. The lateral direction, the longitudinal direction, and the height direction are orthogonal to each other. Further, in Expression 1, "k" and "l" are natural numbers and the sum of "k" and "l" are greater than or equal to 0 and less than or equal to 30. Further, in Expression 1, "N1" and "N2" are 30, respectively. "$P_k(x)$ and "$P_l(y)$" are commonly referred to as Legendre's polynomials. Because Legendre's polynomial is an orthogonal polynomial, the value of the coefficient "$a_{kl}$" does not rely on the expressions "N1" and "N2". Because the expression "z (x, y)" includes all of $a_{kl}P_k(x)P_l(y)$ in a case where the sum of k and l is greater than or equal to 0 and less than or equal to 30, complex surface morphology can be sufficiently expressed with the expression "z (x, y)". The sum of k and l is hereinafter referred to as the order m (m=k+l).

Figure 2:
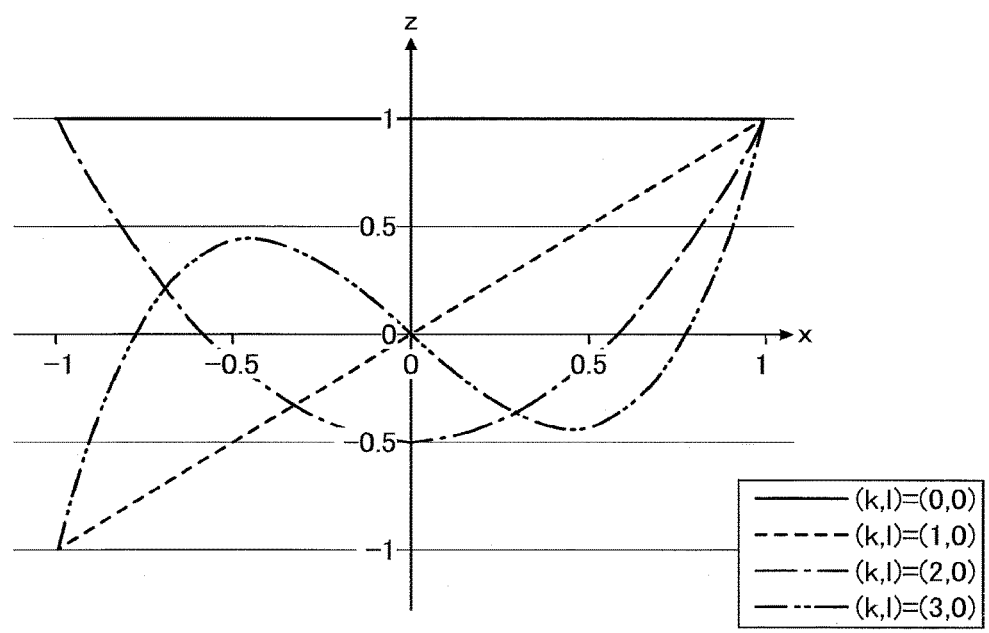
FIG. 2 is a graph illustrating the surface shapes indicated with Pk(x) and Pl(y) in a case where the order is 0, 1, 2, and 3.

FIG. 2 is a graph illustrating surface morphology expressed by $P_k(x) P_l(y)$ in a case where the order of polynomial m is 0, 1, 2, and 3. FIG. 2 depicts representative surfaces morphology expressed by $P_k(x) P_l(y)$ in a case where the combination of (k, l) is (0,0), (1,0), (2,0), and (3,0).

Because the surface expressed by $P_k(x) P_l(y)$ is an offset surface parallel to the xy plane (z=0) in a case where the order m is 0 and a flat surface, the above surface expressed by $P_k(x) P_l(y)$ does not affect the flatness of the center area 11CA, as illustrated with a solid line in FIG. 2.

As illustrated with a broken line in FIG. 2, because the surface expressed by $P_k(x) P_l(y)$ in a case where the order m is 1 is a flat surface inclined relative to the xy plane, the surface expressed by $P_k(x) P_l(y)$ does not affect the flatness of the center area 11CA.

As illustrated with a single dot chain line in FIG. 2, because the surface expressed by $P_k(x) P_l(y)$ in a case where the order m is 2 is a curved surface, the above curved surface affects the flatness of the center region 11CA. However, the curved surface expressed by $P_k(x) P_l(y)$ in a case where the order m is 2 does not affect the accuracy of light exposure. The accuracy of light exposure can be corrected by using a light exposure tool.

As illustrated with a double dot chain line in FIG. 2, because the surface expressed by $P_k(x) P_l(y)$ in a case where the order m is 3 is a curved surface, the above curved surface expressed by $P_k(x) P_l(y)$ affects the flatness of the center region 11CA and the accuracy of light exposure. The order m that may affect the accuracy of light exposure is greater than or equal to 3.

Throughout the specification, the component obtained by adding all of $a_{kl} P_k(x) P_l(y)$ in a case where the order m is greater than or equal to 3 and less than or equal to 9 is hereinafter referred to as "low order component", and the component obtained by adding all of $a_{kl} P_k(x) P_l(y)$ in a case where the order m is greater than or equal to 10 and less than or equal to 30 is hereinafter referred to as "high order component". The interval between the convexes and concaves of the low order component is longer than the interval between the convexes and concaves of the high order component.

In the center area 11CA of the circuit pattern forming surface 11 of this embodiment, the flatness of the low order component is less than or equal to 20 nm and the flatness of the high order component is also less than or equal to 20 nm. Deformation of a circuit pattern of a photomask can be consequently reduced compared to a circuit pattern of a conventional photomask. Throughout the specification, the flatness of the low order component is the maximum height difference of the low order component in the z-direction. Similarly, the flatness of the high order component is the maximum height difference of the high order component in the z-direction.

Further, in the center area 11CA of the circuit pattern forming surface 11 of this embodiment, the flatness of a composite component obtained by compositing the low order component and the high order component is less than or equal to 22 nm. Therefore, pattern overlay accuracy is improved as illustrated described in detail below. Throughout the specification, the term "composite component" refers to a component obtained by adding all of $a_{kl} P_k(x) P_l(y)$ in a case where the order m is greater than or equal to 3 and less than or equal to 30. Further, the flatness of the composite component is the maximum height difference of the composite component in the z-direction.

Figure 3:
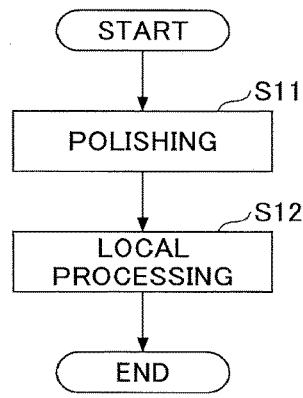
FIG. 3 is a flowchart of a method for manufacturing a glass substrate according to an embodiment of the present invention.
Figure 4:
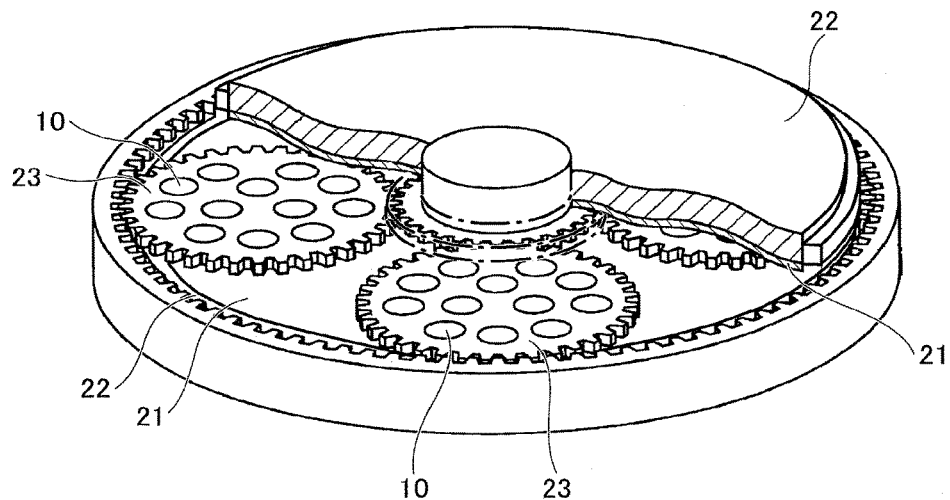
FIG. 4 is a partially cutaway perspective view of a polishing machine for polishing a glass substrate according to an embodiment of the present invention.
Figure 5:
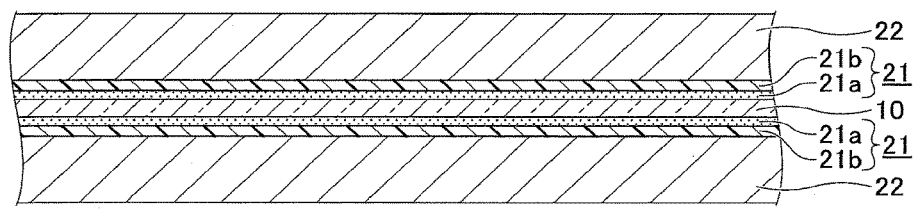
FIG. 5 is a cross-sectional view illustrating a glass substrate in state of polishing the glass substrate according to an embodiment of the present invention.

FIG. 3 is a flowchart of a method for manufacturing the glass substrate 10 according to an embodiment of the present invention. FIG. 4 is a partial cutaway perspective view of a polishing machine used for polishing the glass substrate 10 according to an embodiment of the present invention. FIG. 5 is a cross-sectional view illustrating a state of polishing the glass substrate 10 according to an embodiment of the present invention.

As illustrated in FIG. 3, the method for manufacturing the glass substrate 10 includes a polishing step S11 and a local processing step S12.

In the polishing step S11, a polishing slurry is supplied to a space between the glass substrate 10 and the polishing pad 21, and the entire area of the circuit pattern forming surface 11 of the glass substrate 10 is polished. In the polishing step S11, the polishing of the circuit pattern forming surface 11 may be repeated while replacing the polishing pad 21 and/or the polishing slurry. Further, the entire circuit pattern non-forming surface 12 may also be polished in a similar manner to polishing the circuit pattern forming surface 11.

As illustrated in FIGS. 4 and 5, the polishing pad 21 may be provided on both sides of the glass substrate 10 in the thickness direction of the glass substrate 10. The circuit pattern forming surface 11 and the circuit pattern non-forming surface 12 may be also polished simultaneously by the polishing pads 21. Alternatively, the polishing pad 21 may be provided on one side of the glass substrate 10 in the thickness direction of the glass substrate 10, so that the circuit pattern forming surface 11 and the circuit pattern non-forming surface 12 are polished sequentially by the polishing pad 21. In this case, the order for polishing the circuit pattern forming surface 11 and the circuit pattern non-forming surface 12 is not limited in particular. Either the circuit pattern forming surface 11 or the circuit pattern non-forming surface 12 may be polished before the other one of the circuit pattern forming surface 11 and the circuit pattern non-forming surface 12.

As illustrated in FIGS. 4 and 5, the polishing pad 21 is used in a state adhered to a surface plate 22. The polishing surface of the polishing pad 21 has a greater area than the area of the circuit pattern forming surface 11 and greater than the area of the circuit pattern non-forming surface 12. Further, the radius of the polishing surface of the polishing pad 21 may be greater than the diameter of a carrier 23 that holds the glass substrate 10. In this case, the carrier 23 rotates about a center line of the carrier 23 while revolving about the center line of the polishing pad 21.

The polishing pad 21 may be, for example, a urethane type polishing pad, a non-fabric type polishing pad, or a suede type polishing pad. At least one polishing pad 21 that is used in the polishing step S11 includes a porous resin layer 21a, which may be referred to as a nap layer. The resin layer 21a is formed on a substrate 21b. The resin layer 21a that has a surface to which the glass substrate 10 contacts includes an opening hole formed on the surface contacting the glass substrate 10.

The polishing slurry includes polishing particles and a dispersion medium. The polishing particles may be formed of, for example, colloidal silica or cerium oxide. The dispersion medium may be formed by using, for example, water or an organic solvent. The polishing slurry is supplied in-between the polishing pad 21 and the glass substrate 10.

In the local processing step S12, the pattern forming surface 11 of the glass substrate 10 is locally processed. In the local processing step S12, the circuit pattern forming surface 11 and the circuit pattern non-forming surface 12 may be sequentially processed. The order of processing the circuit pattern forming surface 11 and the circuit pattern non-forming surface 12 is not limited in particular. Either the circuit pattern forming surface 11 or the circuit pattern non-forming surface 12 may be processed before the other one of the circuit pattern forming surface 11 and the circuit pattern non-forming surface 12.

Several processes such as an ion beam etching process, a gas cluster ion beam (GCIB) etching process, a plasma etching process, a wet etching process, a polishing process using a magnetic fluid, or a polishing process using a rotating polishing tool may be used in the local processing step S12.

The ion beam etching process and the GCIB process are suitable for locally correcting the shape of a surface because these processes can change the position to which a beam is radiated. The GCIB process is particularly suitable. The GCIB process is a method that ionizes clusters of gaseous atoms and molecules (gas clusters) and accelerates the gas clusters to locally process a substrate. The source gas used for the gas clusters may be one or a combination of $SF_6$, Ar, $O_2$, $N_2$, $NF_3$, $N_2O$, $CHF_3$, $CF_4$, $C_2F_6$, $C_3F_8$, $C_4F_6$, $SiF_4$, and $COF_2$. Among these gases, $SF_6$ and $NF_3$ are preferred.

The polishing process using a magnetic fluid uses a magnetic fluid including polishing particles. The magnetic fluid may be, for example, a fluid in which a non-colloidal magnetic material is dispersed. The rheological property (e.g., viscosity, elasticity, flexibility) of the fluid changes when the magnetic fluid is placed under a magnetic field. The polishing particles may be formed of, for example, silica, cerium oxide, and diamond.

In the polishing process using a rotating polishing tool, a polishing tool is rotated while contacting the glass substrate 10. The polishing surface to be polished by the rotating polishing tool may have an area smaller than the area of the circuit pattern forming surface 11 and the area of the circuit pattern non-forming surface 12. A slurry including polishing particles is supplied to the rotating polishing tool. The polishing particles may be formed of, for example, silica, cerium oxide, alumina, zirconia, silicon carbide, diamond, titanium, and germanium.

In the local processing step S12, the height difference between a processed area and an unprocessed area of the glass substrate 10 is reduced by locally processing high areas of the circuit patterning forming surface 12 of the glass substrate 10. The local processing step S12 can improve the flatness of a low order component having a long interval between its convex part and its concave part. The flatness of the high order component having a short interval between its convex part and its concave part can be improved by the polishing process of Step S11.

At least one polishing pad 21 used in the polishing step S11 includes the porous resin layer (nap layer) 21a. The resin used to form the resin layer 21a is, for example, polyurethane or polycarbonate.

The 100% modulus of the resin forming the resin layer 21a is, for example, greater than or equal to 5 MPa. The 100% modulus refers to the tensile strength of a sample in a state where the sample is stretched to a length of 100% with respect to an initial length of the sample. The tensile strength is measured based on Japanese Industrial Standards (JISK 6250 3.7). The 100% modulus of the resin is measured in a state where no opening (pore) is formed in the resin.

Since the resin layer 21a is hard in a case where the 100% modulus of the resin included in the resin layer 21a is greater than or equal to 5 MPa, the flatness of the high order component having a short interval between its concave parts and its convex parts can be improved owing to the flat polishing surface of the resin layer 21a. The 100% modulus of the resin included in the resin layer 21a is preferably greater than or equal to 10 MPa.

The speed in the circumferential direction of the rotating polishing pad 21 is different at a center part of the polishing pad 21 and a peripheral part of the polishing pad 21. This difference of rotation speed leads to a difference in the polishing rate. The difference in the polishing rate attributed to the speed difference in the circumferential direction becomes more significant as the resin layer 21a becomes harder and results in degradation of the flatness of the low order component.

The 100% modulus of the resin included in the resin layer 21a is less than or equal to 14 MPa. Because the resin layer 21a is not too hard, the difference of the polishing rate between the central part and the peripheral part of the rotating polishing pad 21 is small. Consequently, the flatness of the low order component having a long interval between its convex parts and its concave parts can be restrained from degrading. The 100% modulus of the resin included in the resin layer 21a is preferably less than or equal to 12 MPa.

In the polishing step S11 of the above-described embodiment, degradation of the flatness of the low order component can be prevented while improving the flatness of the high order component. Further, in the subsequent local processing step S12, the flatness of the low order component can be improved. Accordingly, the glass substrate 10 that has the flatness of the low order component is less than or equal to 20 nm and the flatness of the high order component is less than or equal to 20 nm, is obtained in the center area 11CA of the circuit pattern forming surface 11.

Note that processes other than those described in the polishing step S11 and the local processing step S12 may be added to the method for manufacturing the glass substrate 10.

For example, a finishing (finish-polishing) step may be further added to the method for manufacturing the glass substrate 10. The finishing step is performed after the local processing step S12. In the finishing step, the entire area of the circuit pattern forming surface 11 is polished in a similar manner as the polishing step S11. In addition, the entire area of the circuit pattern non-forming surface 12 may also be polished in the finishing step. Some polishing conditions are set in the finishing step for preventing the flatness of the low order component from degrading again.

Further, the method for manufacturing the glass substrate 10 may also include a cleaning step. The glass substrate 10 is cleaned in the cleaning step. The washing step may be performed, for example, between the polishing step S11 and the local processing step S12, between the local processing step S12 and the finishing step, or after the finishing step.

Figure 6:
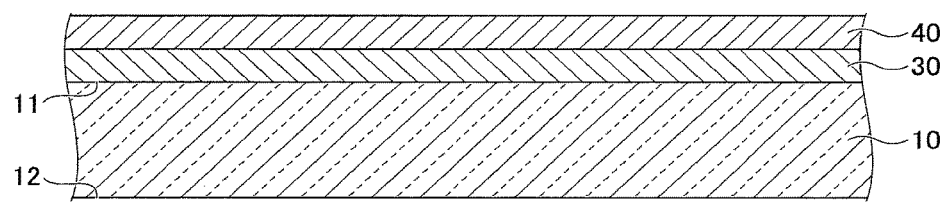
FIG. 6 is a schematic view illustrating a reflection type mask blank according to an embodiment of the present invention.

FIG. 6 illustrates a reflection type mask blank according to an embodiment of the present invention. The reflection type mask blank is formed with the glass substrate 10 of FIG. 1, the reflection film 30, and the absorbing film 40 in this order.

The glass substrate 10 supports the reflection film 30 and the absorbing film 40. The reflection film 30 and the absorbing film 40 are formed on the circuit pattern forming surface 11 of the glass substrate 10 in this order.

The reflection film 30 reflects light such as EUV (Extreme Ultra Violet) light. The reflection film 30 may be, for example, a multilayered reflection film in which a high refractive index layer and a low refractive index layer are alternately layered one on top of the other. The high refractive index layer may be formed of, for example, silicon (Si). The low refractive index layer may be formed of, for example, molybdenum (Mo).

The absorbing film 40 absorbs light. The absorbing film 40 may be formed of, for example, a single metal, a metal alloy, a nitride, an oxide, or an oxynitride, containing at least one element selected from tantalum (Ta), chrome (Cr), and palladium (Pd).

The absorbing film 40 is a film on which a circuit pattern is formed. For example, a photolithography method or an etching method may be used to form the circuit pattern. A resist film that is used when implementing these methods may be included in a mask blank. By forming the circuit pattern on the absorbing film 40, the reflection type photomask can be obtained.

The mask blank that is obtained by depositing various films on the glass substrate 10 may slightly warp due to a stress attributed to the deposition of various films. The shape of the warp is expressed with a component in which the order m is 2 mainly and tends to preclude a component in which the order m is greater than or equal to 3. Therefore, the various films deposited on the glass substrate 10 and the glass substrate 10 have substantially the same flatness in terms of the low order component, the high order component, and the composite component.

Figure 10:
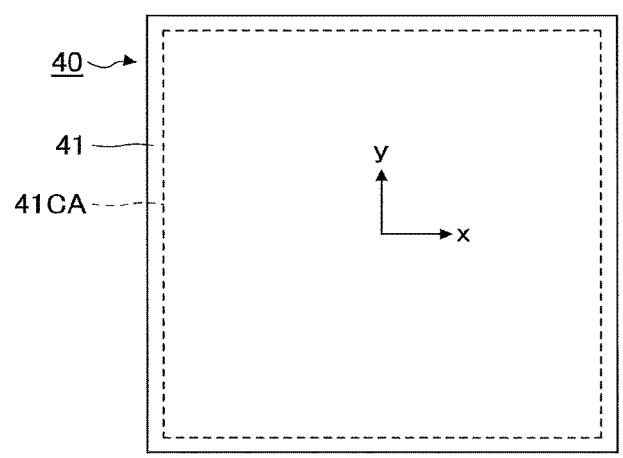
FIG. 10 is a plan view of an absorbing film illustrated in FIG. 6.

FIG. 10 is a plan view of the absorbing film 40 of FIG. 6. As illustrated in FIG. 10, a main surface 41 of the absorbing film 40, which is positioned on the opposite side of the glass substrate 10, has a rectangular shape. The main surface 41 is hereinafter referred to as "circuit pattern forming surface 41".

The circuit pattern forming surface 41 may be, for example, a rectangle having a longitudinal length of 152 mm and a lateral length of 152 mm. In the circuit pattern forming surface 41, a square area having a longitudinal length of 142 mm and a lateral length of 142 mm and excluding the quadrangle frame-shaped outer peripheral area of the circuit pattern forming surface 41 may be referred to as a center area 41CA of the circuit pattern forming surface 41. The center of the center area 41CA matches the center of the circuit pattern forming area 41 from a plan view.

Note that, the longitudinal length of the circuit pattern forming surface 41 of the absorbing film 40 is not to be limited in particular as long as the longitudinal length of the circuit pattern forming surface 41 is greater than 142 mm. The longitudinal length of the circuit pattern forming surface 41 may be smaller than the longitudinal length of the circuit pattern forming surface 11. Further, the lateral length of the circuit pattern forming surface 11 is not to be limited in particular as long as the lateral direction of the circuit pattern forming surface 41 is greater than 142 mm. The lateral length of the circuit pattern forming surface 41 may be smaller than the lateral direction of the circuit pattern forming surface 11. In these cases also, in the circuit pattern forming surface 41, a square area having a longitudinal length of 142 mm and a lateral length of 142 mm and excluding the quadrangle frame-shaped outer peripheral area of the circuit pattern forming surface 41 may be referred to as a center area 41CA of the circuit pattern forming surface 41.

A circuit pattern is formed on the center area 41CA. The plane shape of the center area 41CA may be similar to the above-described plane shape of the center area 11CA. In expressing the plane shape of the center area 41CA with the above-described expression [1], the flatness of the low order component of the center area 41CA is less than or equal to 20 nm and the flatness of the high order component of the center area 41CA is also less than or equal to 20 nm. Therefore, deformation of the circuit pattern of the photomask can be reduced compared to a conventional photomask.

Further, the composite component of the low and high components in the center area 41CA has a flatness less than or equal to 22 nm. Therefore, pattern overlay accuracy can be improved as described in detail below.

Figure 7:
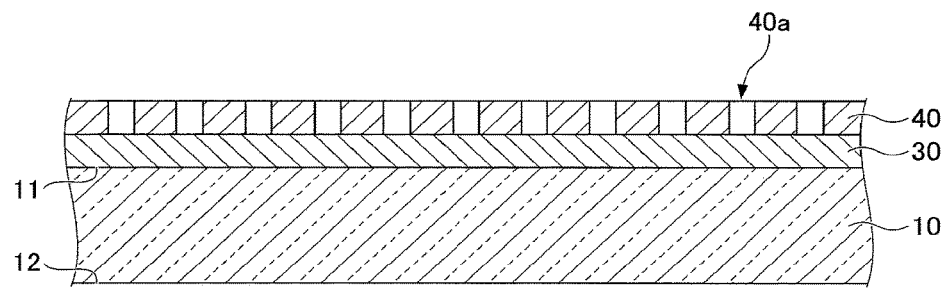
FIG. 7 is a schematic view illustrating a reflection type photomask according to an embodiment of the present invention.

FIG. 7 illustrates a reflection type photomask according to an embodiment of the present invention. The reflection type photomask of FIG. 7 can be obtained by forming a circuit pattern 40a on the absorbing film of the reflection type mask blank of FIG. 6. The obtained reflection type mask blank may be mounted on, for example, an exposure tool having an EUV light source.

Note that the reflection type mask blank and the reflection type photomask may also include films other than the reflection film 30 and the absorbing film 40. For example, a protection film (e.g., Ru, Si, $TiO_2$ and so on) that protects the reflection film 30 during the etching of the absorbing film 40 may be formed between the reflection film 30 and the absorbing film 40. Further, a low reflection film (e.g., TaON, TaO and so on) having low reflectivity against an inspection light radiated to the circuit pattern 40a of the absorbing film 40 may be formed on the opposite side on the reflection film 30 based on the position of the absorbing film 40. Further, a conductive film (e.g., CrN and so on) may be formed on the opposite side of the absorbing film 30 based on the position of the glass substrate 10.

Figure 11:
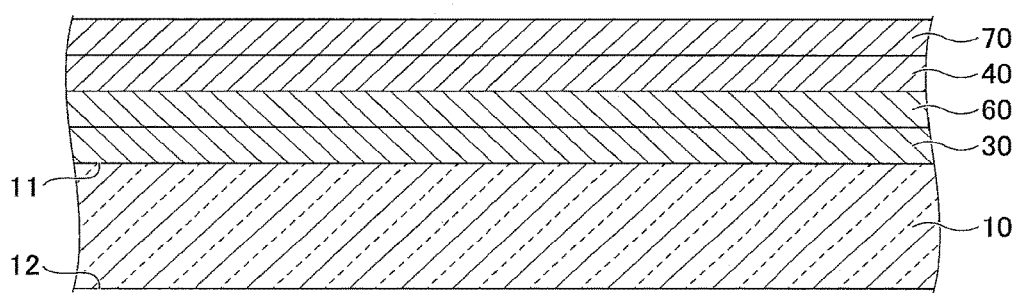
FIG. 11 is a schematic view illustrating a reflection type mask blank according to a modified example.
Figure 12:
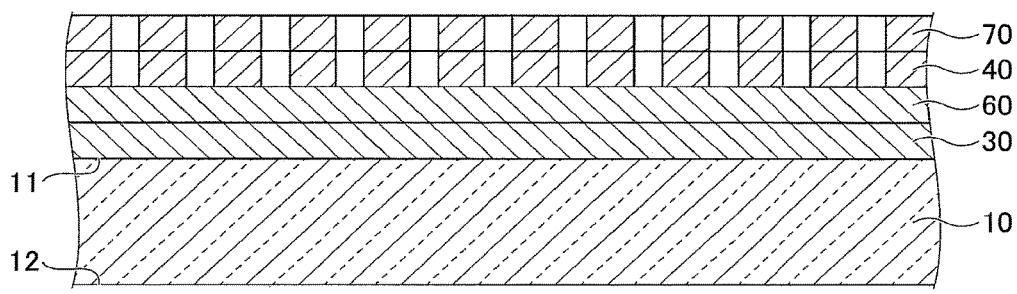
FIG. 12 is a schematic view illustrating a reflection type photomask according to a modified example.

As illustrated in FIG. 11, the reflection type mask blank includes a reflection film 30, an absorbing film 40, and a low reflection film formed on the circuit pattern forming surface 11 of the glass substrate 10 in this order on the side of the circuit pattern forming surface 11. In this case, a circuit pattern is formed on both the absorbing film 40 and the low reflection film 70.

Figure 13:
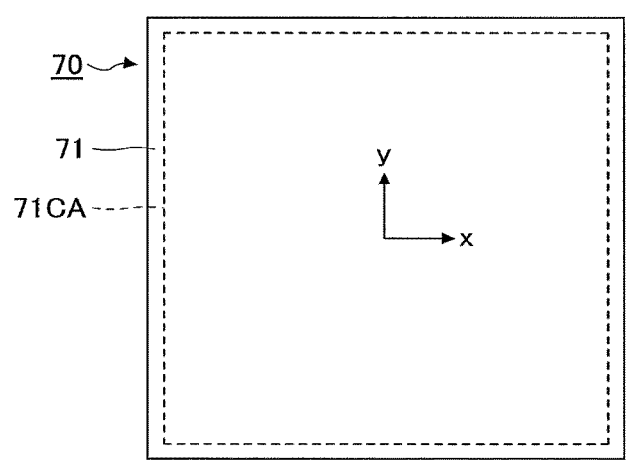
FIG. 13 is a plan view of a low reflection film illustrated in FIG. 11.

FIG. 13 is a plan view illustrating the low reflection film 70 of FIG. 11. As illustrated in FIG. 13, the main surface 71 of the low reflection film 70 on the opposite side of the glass substrate 10 has a rectangular shape. The main surface 71 is hereinafter referred to as "circuit pattern forming surface 71".

The circuit pattern forming surface 71 may be, for example, a rectangle having a longitudinal length of 152 mm and a lateral length of 152 mm. In the circuit pattern forming surface 71, a square area having a longitudinal length of 142 mm and a lateral length of 142 mm and excluding the quadrangle frame-shaped outer peripheral area of the circuit pattern forming surface 71 may be referred to as a center area 71CA of the circuit pattern forming surface 71. The center of the center area 71CA matches the center of the circuit pattern forming area 41 from a plan view.

Note that, the longitudinal length of the circuit pattern forming surface 71 of the low reflection film 70 is not to be limited in particular as long as the longitudinal length of the circuit pattern forming surface 71 is greater than 142 mm. The longitudinal length of the circuit pattern forming surface 71 may be smaller than the longitudinal length of the circuit pattern forming surface 11. Further, the lateral length of the circuit pattern forming surface 71 is not to be limited in particular as long as the lateral direction of the circuit pattern forming surface 71 is greater than 142 mm. The lateral length of the circuit pattern forming surface 41 may be smaller than the lateral direction of the circuit pattern forming surface 11. In these cases also, in the circuit pattern forming surface 71, a square area having a longitudinal length of 142 mm and a lateral length of 142 mm and excluding the quadrangle frame-shaped outer peripheral area of the circuit pattern forming surface 71 may be referred to as a center area 71CA of the circuit pattern forming surface 71.

A circuit pattern is formed on the center area 71CA. The plane shape of the center area 71CA may be similar to the above-described plane shape of the center area 11CA. In expressing the plane shape of the center area 71CA with the above-described expression [1], the flatness of the low order component of the center area 71CA is less than or equal to 20 nm and the flatness of the high order component of the center area 71CA is also less than or equal to 20 nm. Deformation of the circuit pattern of the photomask can be consequently reduced compared to a conventional photomask.

Further, the composite component of the low and high components in the center area 41CA has a flatness less than or equal to 22 nm. Therefore, pattern overlay accuracy can be improved as described in detail below.

With the above-described embodiment of the present invention, the flatness of the center area of the main surface of the glass substrate 10 can be improved. Thereby, the pattern overlay accuracy of the circuit pattern of the reflection type photomask can be improved.

Figure 8:
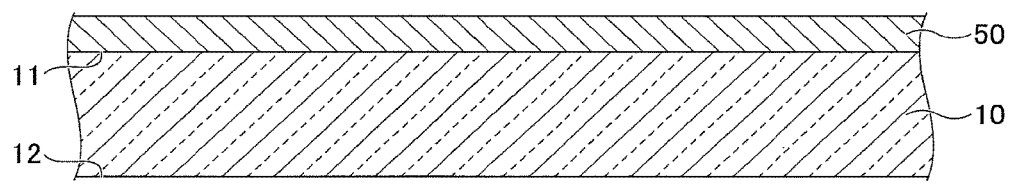
FIG. 8 is a schematic view illustrating a transmitting type mask blank according to an embodiment of the present invention.

FIG. 8 illustrates a light-transmitting type mask blank according to an embodiment of the present invention. The light-transmitting type mask blank includes a polished glass substrate 10 of FIG. 1 and a light-shielding film 50.

The glass substrate 10 supports the light-shielding film 50. The light-shielding film 50 is formed on the circuit pattern forming surface 11 of the glass substrate 10.

The light-shielding film 50, shields light radiated to the glass substrate 10. The light-shielding film 50 is formed of, for example, chrome (Cr) and so on.

The light-shielding film 50 is a film on which a circuit pattern is formed. For example, a photolithography method or an etching method may be used to form the circuit pattern on the light-shielding film 50. A resist film that is used when implementing these methods may be included in a mask blank. By forming the circuit pattern on the light-shielding film 50, a light transmitting type photomask can be obtained.

Figure 14:
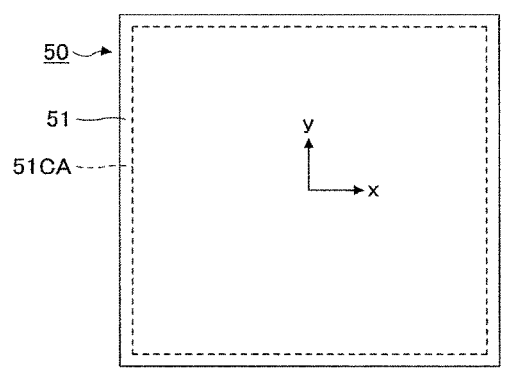
FIG. 14 is a plan view of a light-shielding film illustrated in FIG. 8.

FIG. 14 is a plan view of the light-shielding film of FIG. 8. As illustrated in FIG. 14, a main surface 50 of the light-shielding film 50 on the opposite side of the glass substrate 10 has a rectangular shape. The main surface 51 is hereinafter referred to as a "circuit pattern forming surface 51".

The circuit pattern forming surface 51 may be, for example, a rectangle having a longitudinal length of 152 mm and a lateral length of 152 mm. In the circuit pattern forming surface 51, a square area having a longitudinal length of 142 mm and a lateral length of 142 mm and excluding the quadrangle frame-shaped outer peripheral area of the circuit pattern forming surface 51 may be referred to as a center area 51CA of the circuit pattern forming surface 51. The center of the center area 51CA matches the center of the circuit pattern forming area 11 of the glass substrate 10 from a plan view.

Note that, the longitudinal length of the circuit pattern forming surface 51 of the light-shielding film 50 is not to be limited in particular as long as the longitudinal length of the circuit pattern forming surface 51 is greater than 142 mm. The longitudinal length of the circuit pattern forming surface 51 may be smaller than the longitudinal length of the circuit pattern forming surface 11 of the glass substrate 10. Further, the lateral length of the circuit pattern forming surface 51 is not to be limited in particular as long as the lateral direction of the circuit pattern forming surface 51 is greater than 142 mm. The lateral length of the circuit pattern forming surface 51 may be smaller than the lateral direction of the circuit pattern forming surface 11 of the glass substrate 10. In these cases also, in the circuit pattern forming surface 51, a square area having a longitudinal length of 142 mm and a lateral length of 142 mm and excluding the quadrangle frame-shaped outer peripheral area of the circuit pattern forming surface 51 may be referred to as a center area 51CA of the circuit pattern forming surface 51. A circuit pattern is formed on the center area 51CA. The plane shape of the center area 51CA may be similar to the above-described plane shape of the center area 11CA. In expressing the plane shape of the center area 51CA with the above-described expression [1], the flatness of the low order component of the center area 51CA is less than or equal to 20 nm and the flatness of the high order component of the center area 51CA is also less than or equal to 20 nm. Therefore, deformation of the circuit pattern of the photomask can be reduced compared to a conventional photomask.

Further, the composite component of the low and high components in the center area 51CA has a flatness less than or equal to 22 nm. Therefore, pattern overlay accuracy can be improved as described in detail below.

Figure 9:
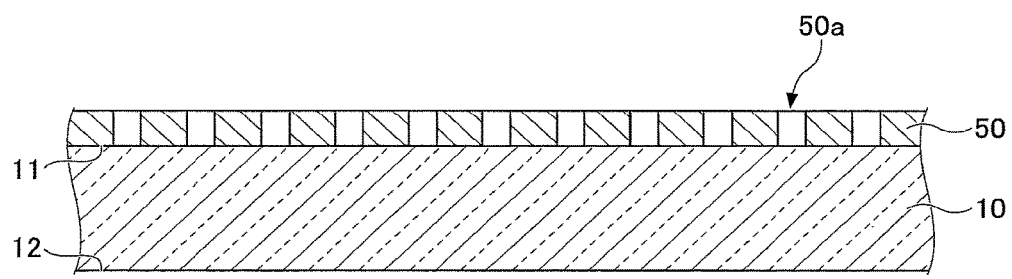
FIG. 9 is a schematic view illustrating a transmitting type photomask according to an embodiment of the present invention.

FIG. 9 illustrates a light-transmitting type photomask according to an embodiment of the present invention. The light-transmitting type photomask of FIG. 9 can be obtained by forming a circuit pattern 50a on the light-shielding film 50 of the light-transmitting type mask blank of FIG. 8. The obtained light-transmitting photomask is mounted on an exposure tool having a light source such as an ArF excimer laser, a KrF excimer laser, or a mercury lamp.

Note that the light-transmitting type mask blank and the light-transmitting type photomask may include a halftone type phase shift film instead of the light-shielding film 50. The phase shift film imparts some phase difference to the light transmitted through the photomask, so that resolution is improved by utilizing the interference of the light transmitted through the photomask.

According to the above-described embodiment of the present invention, the flatness of the center area of the main surface of the glass substrate 10 can be improved. Thereby, the pattern overlay accuracy of the circuit pattern of the light-transmitting type photomask can be improved.

Practical Examples

In the following samples 1 to 6, glass substrates are manufactured under the same conditions except for using different types of resin used for forming the nap layer in a second polishing step. Then, the flatness of the center area of the circuit pattern forming surface of each of the manufactured glass substrates was measured. The samples 1 to 3 are practical examples of the present invention whereas the samples 4 to 6 are comparative examples.

In manufacturing the glass substrate, the polishing step, the local processing step, and the finishing step were performed in this order. In the polishing step, a first polishing step, a second polishing step, and a third polishing step were performed in this order. Next, each of the polishing step, the local processing step, and the finishing step are described.

[First Polishing Step]

In the first polishing step, two main surfaces of the glass substrate were simultaneously polished by using the double-side polishing machine of FIG. 4. In the first polishing step, the below-described polishing slurry and the below-described polishing pad were used.

Polishing slurry: a cerium oxide solution including polishing particles having an average particle diameter of 1.5 μm.

Polishing pad: a urethane type polishing pad

After the first polishing step, a cleaning step was performed before proceeding to the second polishing step.

[Second Polishing Step]

In the second polishing step, the two main surfaces of the glass substrate were simultaneously polished by using the double-side polishing machine of FIG. 4. In the second polishing step, the below-described polishing slurry and polishing pad were used.

Polishing slurry: a cerium oxide solution including polishing particles having an average particle diameter of 1.0 μm.
Polishing pad: a polishing pad having a nap layer formed on a polyethylene terephthalate substrate After the second polishing step, a cleaning step was performed before proceeding to the third polishing step.
[Third Polishing Step]

In the third polishing step, the two main surfaces of the glass substrate were simultaneously polished by using the double-side polishing machine of FIG. 4. In the third polishing step, the below-described polishing slurry and polishing pad were used.
Polishing slurry: a colloidal silica solution being adjusted to pH3 and including polishing particles having an average particle diameter of 30 nm.
Polishing pad: an ultra-soft polisher After the third polishing step, a cleaning step was performed before proceeding to the local processing step.
[Local Processing Step]

In the local processing step, local areas of the two main surfaces of the glass substrate were sequentially processed by using a single-side polishing machine. In the local processing step, the below-described polishing slurry and polishing pad were used.
Polishing slurry: a cerium oxide solution including polishing particles having an average particle diameter of 1.0 μm.
Polishing pad: a soft polisher After the local processing step, a cleaning step was performed before proceeding to the finishing step.
[Finishing Step]

In the finishing step, the two main surfaces of the glass substrate were simultaneously polished by using the double-side polishing machine of FIG. 4. In the finishing step, the below-described polishing slurry and polishing pad were used.
Polishing slurry: a colloidal silica solution being adjusted to pH3 and including polishing particles having an average particle diameter of 30 nm.
Polishing pad: an ultra-soft polisher After the finishing step, a cleaning step was performed before measuring the flatness of the center area of the circuit pattern forming surface of the glass substrate.
[Measurement of Flatness of Circuit Pattern Forming Surface of Glass Substrate]

The flatness of the center area of the circuit pattern forming surface was measured by using a flatness measurement machine manufactured by Fujinon Corp. Further, the flatness of the high order component in the center area of the circuit pattern forming surface, the flatness of the low order component in the center area of the circuit pattern forming surface, and the flatness of the composite components was measured.
[Reflection Film Depositing Step]

In the reflection film depositing step, an Mo/Si multilayer reflection film having a thickness of 340 nm was formed as the reflection film 30. The reflection film 30 was formed by repeating of a process of alternately depositing a Mo layer having a thickness of 2.3 nm and a Si layer having a thickness of 4.5 nm for 50 times. The Mo and Si layers were alternately deposited on a first main surface of the glass substrate. The Mo and Si layers were formed by performing an ion beam sputtering process on the first main surface of the glass substrate.

The conditions for depositing the Mo layer were as follows.
Target: Mo target
Sputtering gas: Ar gas (gas pressure: 0.02 Pa)
Voltage: 700 V
Deposition rate: 0.064 nm/sec.
Film thickness: 2.3 nm The conditions for depositing the Si layer were as follows.
Target: Si target (Boron doped)
Sputtering gas: Ar gas (gas pressure: 0.02 Pa)
Voltage: 700 V
Deposition rate: 0.077 nm/sec.
Film thickness: 4.5 nm
[Protection Film Depositing Step]

In the protection film depositing step, an Ru layer (not illustrated) was formed on the reflection film by using an ion beam sputtering process. The conditions for depositing the protection film were as follows.
Target: Ru target
Sputtering gas: Ar gas (gas pressure: 0.02 Pa)
Voltage: 700 V
Deposition rate: 0.052 nm/sec.
Film thickness: 2.5 nm
[Absorbing Film Depositing Step]

Then, a TaN layer serving as the absorbing film 40 was formed on the protection film. The TaN layer was deposited on the protection film by using a magnetron sputtering process. The conditions for depositing the TaN layer were as follows.
Target: Ta target
Sputtering gas: mixed gas including Ar gas and $N_2$ gas (Ar: 86 vol %, $N_2$: 14 vol %, gas pressure: 0.3 Pa)
Applied electric power: 150 W
Deposition rate: 7.2 nm/sec.
Film thickness: 60 nm
[Low Reflection Film Depositing Step]

In the low reflection film depositing step, a TaON layer (not illustrated) was formed on the absorbing film by using an magnetron sputtering process. The conditions for depositing the low reflection film were as follows.
Target: Ta target
Sputtering gas: mixed gas including Ar gas, $O_2$ gas, and $N_2$ gas (Ar: 49 vol %, $O_2$: 37 vol %, and $N_2$: 14 vol %, gas pressure: 0.3 Pa)
Applied electric power: 250 W
Deposition rate: 2.0 nm/sec.
Film thickness: 8 nm
[Measuring of Flatness of Circuit Pattern Forming Surface of Low Reflection Film]

The flatness of the center area of the circuit pattern forming surface of the low reflection film was measured by using the flatness measurement machine manufactured by Fujinon Corp. Further, the flatness of the high order component in the center area of the circuit pattern forming surface, the flatness of the low order component in the center area of the circuit pattern forming surface, and the flatness of the composite components were measured.
[Calculation of Pattern Overlay Accuracy]

The pattern overlay accuracy (out of plane distortion (OPD)) was calculated by using the method described in Non-Patent Document "EUV Mask flatness compensation in writing and exposure tools relating to total overlay", N. Harned, et. al., 2007 International EUVL Symposium. More specifically, the OPD was calculated as the product of the flatness of the composite components of the center area of the circuit pattern forming surface of the low reflection film, the tangent of an incident angle of an exposing light (specifically, tan 6°), and the reduction ratio during exposure (specifically, 1/4). The OPD indicates the size of deviation of a pattern in a case where the flatness of the center area was 0 with respect to a target plane.

The results of measuring and calculating the flatness of the center area of the circuit pattern forming surface of the low reflection film are depicted in Table 1. In Table 1, the item "All components of second order or higher" indicates a composition of a component in which its order m is 2, a low order component, and a high order component.

TABLE 1

| | 100% MODULUS OF RESIN OF NAP LAYER OF SECOND POLISHING PAD (MPa) | FLATNESS OF CENTER AREA OF CIRCUIT PATTERN FORMING SURFACE OF GLASS SUBSTRATE (nm) | | | |
|---|---|---|---|---|---|
| | | ALL COMPONENTS OF SECOND ORDER OR HIGHER | LOW ORDER COMPONENTS | HIGH ORDER COMPONENTS | COMPOSITE COMPONENTS |
| SAMPLE 1 | 6 | 19 | 9 | 17 | 18 |
| SAMPLE 2 | 12 | 11 | 8 | 8 | 11 |
| SAMPLE 3 | 14 | 18 | 17 | 5 | 17 |
| SAMPLE 4 | 3 | 36 | 19 | 30 | 34 |
| SAMPLE 5 | 16 | 25 | 24 | 5 | 23 |
| SAMPLE 6 | 20 | 42 | 42 | 5 | 40 |

| | FLATNESS OF CENTER AREA OF CIRCUIT PATTERN FORMING SURFACE OF LOW REFLECTION FILM (nm) | | | | PATTERN OVERLAY ACCURACY (OPD) (nm) |
|---|---|---|---|---|---|
| | ALL COMPONENTS OF SECOND ORDER OR HIGHER | LOW ORDER COMPONENTS | HIGH ORDER COMPONENTS | COMPOSITE COMPONENTS | |
| SAMPLE 1 | 110 | 9 | 17 | 18 | 0.48 |
| SAMPLE 2 | 117 | 8 | 8 | 11 | 0.28 |
| SAMPLE 3 | 101 | 17 | 5 | 17 | 0.44 |
| SAMPLE 4 | 108 | 19 | 30 | 34 | 0.89 |
| SAMPLE 5 | 135 | 24 | 5 | 23 | 0.61 |
| SAMPLE 6 | 115 | 42 | 5 | 40 | 1.06 |

As illustrated in Table 1, the results of the samples 1 to 3 indicate that the 100% modulus of the resin included in the nap layer of the second polishing pads was greater than or equal to 5 MPa and less than or equal to 14 MPa. Accordingly, the center area of the circuit pattern forming surface of the glass substrate and the low reflection film of samples 1 to 3 indicate that the flatness of the low order component was less than or equal to 20 nm and the flatness of the high order component was less than or equal to 20 nm. On the other hand, the results of the sample 4 indicate that the 100% modulus of the resin included in the nap layer of the second polishing pads was less than 5 MPa (i.e., too soft). Accordingly, the center area of the circuit pattern forming surface of the glass substrate and the low reflection film of sample 4 indicate that the flatness of the high order component was greater than 20 nm. Further, the results of samples 5 and 6 indicate that the 100% modulus of the resin included in the nap layer of the second polishing pads was greater than 14 MPa (i.e., too hard). Accordingly, the center area of the circuit pattern forming surface of the glass substrate and the low reflection film of samples 5 and 6 indicate that the flatness of the low order component was greater than 20 nm. The samples 1 to 3 have smaller OPD compared to the samples 4 to 6.

With the above-described embodiments of the present invention, the flatness of a center area of a main surface of a glass substrate for a mask blank can be improved. Further, the glass substrate can attain a sufficient pattern overlay accuracy.

Hence, although embodiments of a glass substrate for a mask blank are described above, the present invention is not limited to the specifically disclosed embodiments, and variations and modifications may be made without departing from the scope of the present invention.

What is claimed is:

1. A glass substrate for a mask blank, the glass substrate comprising:

a rectangular-shaped main surface on which a film having a circuit pattern is to be formed;

wherein the rectangular-shaped main surface comprises a quadrangular peripheral frame and a square-shaped center area defined by excluding the quadrangular peripheral frame from the rectangular-shaped main surface, wherein the square-shaped center area has a longitudinal length of 142 mm and a lateral length of 142 mm, and wherein a surface morphology of the square-shaped center area z(x, y) is expressed by $$\begin{cases} z(x, y) = \sum_{k=0}^{N_1} \sum_{l=0}^{N_2} a_{kl} P_k(x) P_l(y) \\ P_k(x) = \frac{1}{2^k k!} \frac{d^k}{dx^k} [(x^2 - 1)^k] \\ P_l(y) = \frac{1}{2^l l!} \frac{d^l}{dy^l} [(y^2 - 1)^l] \end{cases}$$

wherein x indicates a coordinate in a lateral direction of the mask blank, y indicates a coordinate in a longitudinal direction of the mask blank, and z indicates a coordinates in a height direction of the mask blank, and wherein a flatness of a sum of combinations of $a_{kl}P_k(x)P_l(y)$, where k and l are each an integer and a sum of k and l is from 3 to 30, is 22 nm or less.

2. A mask blank comprising:

the glass substrate of claim 1; and a film on which the circuit pattern is to be formed.

3. The mask blank as claimed in claim 2, wherein the film is a light-shielding film that shields light.

4. The mask blank as claimed in claim 2, wherein the film is an absorbing film that absorbs light, and wherein a reflection film that reflects the light is provided between the absorbing film and the glass substrate.

5. A photomask comprising:
the glass substrate of claim 1; and
a film having the circuit pattern.

6. The photomask as claimed in claim 5, wherein the film is a light-shielding film that shields light.

7. The photomask as claimed in claim 5,
wherein the film is an absorbing film that absorbs light, and
wherein a reflection film that reflects the light is provided between the absorbing film and the glass substrate.

8. A mask blank comprising:
a glass substrate including a rectangular-shaped main surface; and
a film formed on the rectangular-shaped main surface of the glass substrate, a circuit pattern being to be formed on the film;
wherein the main surface of the film on the opposite side of the glass substrate is rectangular-shaped and comprises a quadrangular peripheral frame and a square-shaped center area defined by excluding the quadrangular peripheral frame from the rectangular-shaped main surface,
wherein the square-shaped center area has a longitudinal length of 142 mm and a lateral length of 142 mm, and
wherein a surface morphology of the square-shaped center area z(x, y) is expressed by $$\begin{cases} z(x, y) = \sum_{k=0}^{N_1} \sum_{l=0}^{N_2} a_{kl} P_k(x) P_l(y) \\ P_k(x) = \frac{1}{2^k k!} \frac{d^k}{dx^k} \left[ (x^2 - 1)^k \right] \\ P_l(y) = \frac{1}{2^l l!} \frac{d^l}{dy^l} \left[ (y^2 - 1)^l \right] \end{cases}$$

wherein x indicates a coordinate in a lateral direction of the mask blank, y indicates a coordinate in a longitudinal direction of the mask blank, and z indicates a coordinates in a height direction of the mask blank, and wherein a flatness of a sum of combinations of $a_{kl} P_k(x) P_l(y)$, where k and l are each an integer and a sum of k and l is from 3 to 30, is 22 nm or less.

9. The mask blank as claimed in claim 8, wherein the film is a light-shielding film that shields light.

10. The mask blank as claimed in claim 8, wherein the film is an absorbing film that absorbs light, and wherein a reflection film that reflects the light is provided between the absorbing film and the glass substrate.

11. The mask blank as claimed in claim 8, wherein the film is a low reflection film, wherein the mask blank further comprises:

a reflection film that reflects light, provided between the glass substrate and the low reflection film; and an absorbing film that absorbs the light, provided between the reflection film and the low reflection film, and wherein the low reflection film reflects an inspection light of the circuit pattern to be formed on the absorbing film, with reflectivity lower than reflectivity of the absorbing film.

* * * * *